United States Patent
Sanada

(10) Patent No.: US 10,784,434 B2
(45) Date of Patent: Sep. 22, 2020

(54) PIEZOELECTRIC ELEMENT

(71) Applicant: KYOCERA Corporation, Kyoto-shi, Kyoto (JP)

(72) Inventor: Hidekazu Sanada, Kirishima (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 380 days.

(21) Appl. No.: 15/574,406

(22) PCT Filed: Apr. 20, 2016

(86) PCT No.: PCT/JP2016/062534
§ 371 (c)(1),
(2) Date: Nov. 15, 2017

(87) PCT Pub. No.: WO2017/033493
PCT Pub. Date: Mar. 2, 2017

(65) Prior Publication Data
US 2018/0138390 A1 May 17, 2018

(30) Foreign Application Priority Data

Aug. 26, 2015 (JP) ................. 2015-166894

(51) Int. Cl.
*H01L 41/047* (2006.01)
*G01L 1/16* (2006.01)
*H01L 41/29* (2013.01)
*H01L 41/187* (2006.01)
*H01L 41/113* (2006.01)

(52) U.S. Cl.
CPC ............. *H01L 41/047* (2013.01); *G01L 1/16* (2013.01); *H01L 41/1873* (2013.01); *H01L 41/1132* (2013.01); *H01L 41/29* (2013.01)

(58) Field of Classification Search
CPC ...... G01L 1/16; H01L 41/1873; H01L 41/047
See application file for complete search history.

(56) References Cited

U.S. PATENT DOCUMENTS 6,080,328 A  6/2000  Horikawa
6,111,341 A *  8/2000  Hirama .............. H03H 9/13
                                                    310/312

FOREIGN PATENT DOCUMENTS

| JP | 57-148916 U1 | 9/1982 |
| JP | 04-105375 A | 4/1992 |
| JP | 11-292625 A | 10/1999 |
| JP | 2007-336504 A | 12/2007 |

OTHER PUBLICATIONS

International Search Report, PCT/JP2016/062534, dated Jul. 12, 2016, 2 pgs.

* cited by examiner

*Primary Examiner* — Thomas M Dougherty
*Assistant Examiner* — Karen B Addison
(74) *Attorney, Agent, or Firm* — Volpe and Koenig, P.C.

(57) ABSTRACT

A piezoelectric element includes a plate-shaped piezoelectric body having one principal face and the other principal face which are opposite to each other; and a first surface electrode mounted on the one principal face and a second surface electrode mounted on the other principal face, at least one of the first surface electrode and the second surface electrode including a center part and a peripheral part which is greater in thickness than the center part, the peripheral part having a thicker region and a thinner region which is thinner than the thicker region.

6 Claims, 4 Drawing Sheets

PIEZOELECTRIC ELEMENT

TECHNICAL FIELD

The present invention relates to a piezoelectric element used as a pressure sensor element, a piezoelectric drive element (a piezoelectric actuator), a piezoelectric circuit element, or the like.

BACKGROUND ART

For example, a piezoelectric element used as a pressure sensor is incorporated into part of an engine, a suspension, or the like of an automobile and thereby utilized for combustion control of the engine or attitude control of a car body. As an example of such a piezoelectric element, there is known a configuration that surface electrodes are individually provided on principal faces opposite to each other of a plate-shaped piezoelectric body (for example, see Patent Literature 1).

CITATION LIST

Patent Literature

Patent Literature 1: Japanese Unexamined Patent Publication JP-A 11-292625 (1999)

SUMMARY OF INVENTION

Technical Problem

In the above-mentioned piezoelectric element, the surface electrodes may be formed by screen printing. Here, in each surface electrode formed by screen printing, in some cases, a peripheral part of the surface electrode becomes greater in thickness than a center part of the surface electrode.

In such a piezoelectric element, when a force perpendicular to a surface of the piezoelectric element on which a pressure acts is applied to the surface of the piezoelectric element, a stress is concentrated on the peripheral part of the surface electrode which is greater in thickness, and therefore there has been a possibility that cracks occur in an interface between the surface electrode and the piezoelectric body.

The invention has been devised in view of the above-mentioned problem. An object thereof is to provide a piezoelectric element in which occurrence of cracks in the interface between each surface electrode and the piezoelectric body is suppressed so that the long term reliability is improved.

Solution to Problem

The piezoelectric element according to an aspect of the invention is a piezoelectric element including: a plate-shaped piezoelectric body having one principal face and the other principal face which are opposite to each other; and a first surface electrode mounted on the one principal face and a second surface electrode mounted on the other principal face, at least one of the first surface electrode and the second surface electrode, including a center part and a peripheral part which is greater in thickness than the center part, the peripheral part having a thicker region and a thinner region which is thinner than the thicker region.

Advantageous Effects of Invention

According to the piezoelectric element according to an aspect of the invention, it is possible to obtain a piezoelectric element in which occurrence of cracks in an interface between each surface electrode and the piezoelectric body is suppressed so that the long term reliability is improved.

DESCRIPTION OF EMBODIMENTS

An example of the piezoelectric element of the present embodiment is described below with reference to the drawings. Here, the following description is given mainly for an example that the piezoelectric element is used as a pressure sensor. Further, the same configurations are designated by the same reference numbers.

Figure 1A:
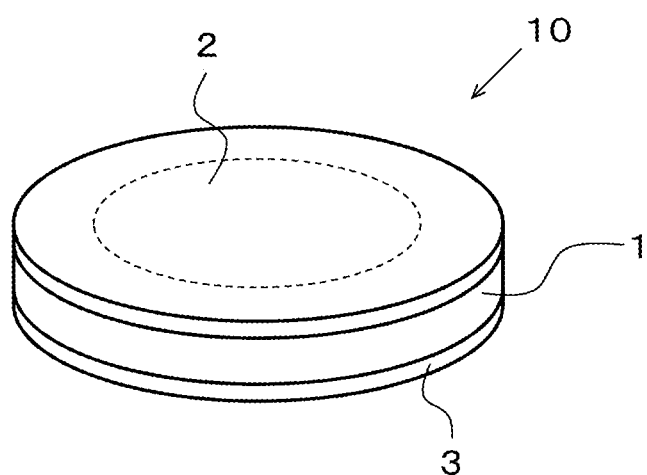
FIG. 1A is a schematic perspective view showing an example of a piezoelectric element of the present embodiment.
Figure 1B:
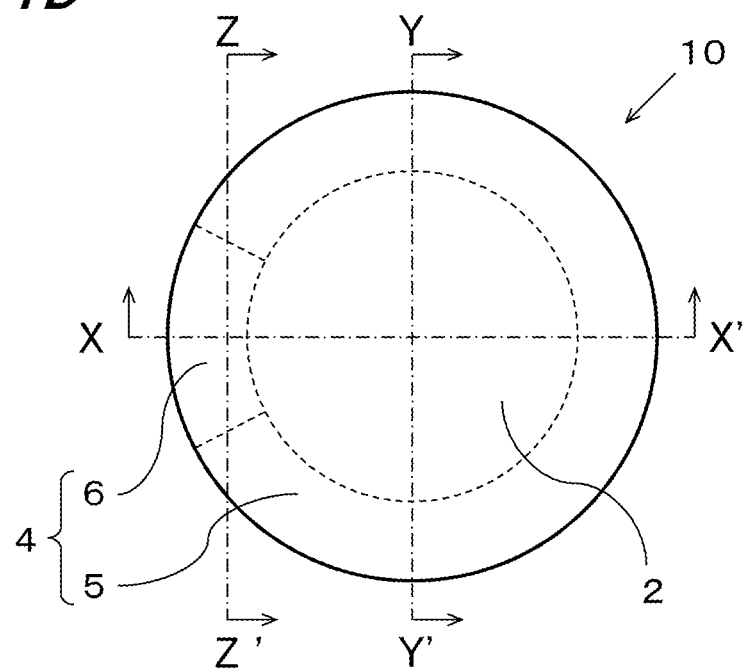
FIG. 1B is a schematic plan view of a piezoelectric element shown in FIG. 1A.
Figure 2A:
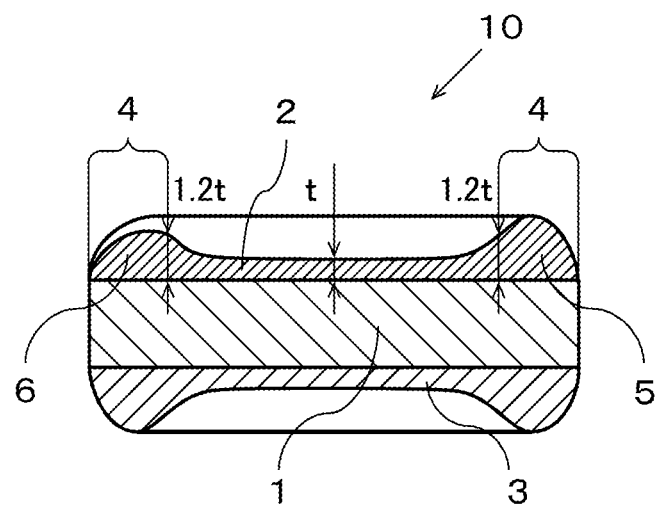
FIG. 2A is a sectional view taken along the line X-X' in FIG. 1B.
Figure 2B:
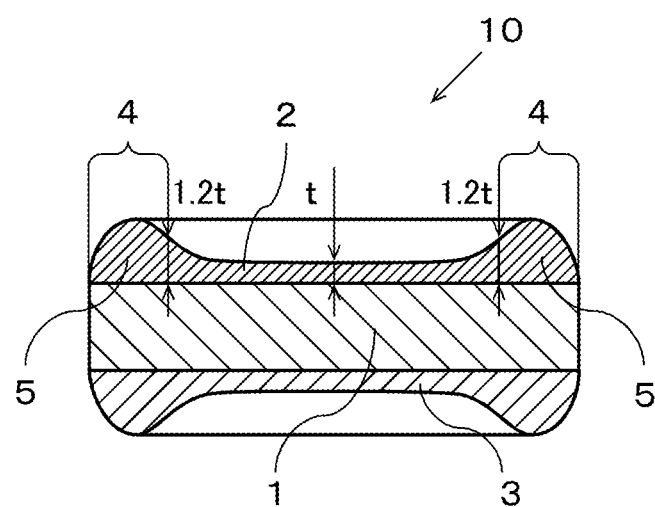
FIG. 2B is a sectional view taken along the line Y-Y' in FIG. 1B.

FIG. 1A is a schematic perspective view showing an example of a piezoelectric element of the present embodiment, and FIG. 1B is a schematic plan view of a piezoelectric element shown in FIG. 1A. Further, FIG. 2A is a sectional view taken along the line X-X' in FIG. 1B, and FIG. 2B is a sectional view taken along the line Y-Y' in FIG. 1B.

A piezoelectric element 10 shown in FIGS. 1A and 1B includes: a plate-shaped piezoelectric body 1 having one principal face and the other principal face which are opposite to each other; and a first surface electrode 2 mounted on the one principal face and a second surface electrode 3 mounted on the other principal face, at least one of the first surface electrode 2 and the second surface electrode 3, including a center part and a peripheral part 4 which is greater in thickness than the center part, the peripheral part 4 having a thicker region 5 and a thinner region 6 which is thinner than the thicker region 5.

The piezoelectric body 1 is made of ceramics having a piezoelectric property and formed in a plate shape. Employable ones of such ceramics include: a perovskite type oxide such as lead zirconate titanate ($PbZrO_3$—$PbTiO_3$); lithium niobate ($LiNbO_3$); and lithium tantalate ($LiTaO_3$). For example, the thickness of the piezoelectric body 1 is set to be 100 μm to 10 mm. Further, the shape of the piezoelectric body 1 in a plan view may thereof be arbitrary like circular, elliptical, and polygonal. For example, in a case of circular shape, the diameter is set to be 0.5 to 20 mm.

The first surface electrode 2 and the second surface electrode 3 are provided opposite to each other on a pair of the principal faces opposite to each other of the plate-shaped piezoelectric body 1. Employable materials for formation of the first surface electrode 2 and the second surface electrode 3 include: a conductor composed mainly of silver or a silver-palladium alloy; and a conductor containing gold, copper, platinum, chromium, or the like.

Here, as shown in FIGS. 2A and 2B, in the piezoelectric element 10 of the present embodiment, the first surface electrode 2 has the peripheral part 4 which is greater in thickness than the center part. Then, the peripheral part 4 includes the thicker region 5 and the thinner region 6 which is thinner than the thicker region 5. That is, in the peripheral part 4 of the first surface electrode 2, the thickness measured from the one principal face of the piezoelectric body 1 is not constant, and hence the peripheral part 4 includes the thicker region 5 which is greater in thickness measured from the one principal face of the piezoelectric body 1 and the thinner region 6 which is less in thickness measured from the one principal face of the piezoelectric body 1 than the thicker region 5. This causes a thickness difference between the thicker region 5 and the thinner region 6. Here, as for the thickness of the peripheral part 4 in the first surface electrode 2, even the thinner region 6 is thicker than the center part.

The peripheral part 4 indicates a region extending along the outer periphery of the piezoelectric body 1 in the first surface electrode 2. Specifically, the peripheral part 4 indicates a region located outside a portion which, when viewed from the center part of the piezoelectric body 1 toward the outer periphery, becomes greater in thickness than the center part by 20% or higher. That is, as shown in FIGS. 2A and 2B, in a case where the thickness of the center part is denoted by t, when viewed from the center part of the first surface electrode toward the outer periphery, the region located outside a portion whose thickness becomes 1.2 t is defined as the peripheral part 4.

Further, in the peripheral part 4, in a plan view thereof, when two outer periphery portions located opposite to each other with the center, or the centroid, of the first surface electrode 2 positioned in between are considered, it is preferable that the distance of each portion measured from the outer periphery is 15% or smaller of the distance between the two portions opposite to each other. For example, in a case where the piezoelectric body 1 is circular in a plan view thereof, it is preferable that the peripheral part 4 of the first surface electrode 2 has the distance of each portion measured from the outer periphery of 15% or smaller of the diameter. By virtue of this, in a case where the piezoelectric element 10 is used as a pressure sensor, the precision of the sensor sensitivity can be improved.

Then, the peripheral part 4 includes the thicker region 5 which is greater in thickness measured from the one principal face of the piezoelectric body 1 and the thinner region 6 is thinner than the thicker region 5. For example, in the peripheral part 4, in a case where the thickness of the thickest portion is denoted by tMax and the thickness of the thinnest portion is denoted by tMin and where the middle thickness ((tMax+tMin)/2) between tMax and tMin is denoted by tMid, the region thicker than tMid is defined as the thicker region 5 and the region thinner than tMid is defined as the thinner region 6. Here, it is preferable that the difference between the thickness tMax of the thickest portion in the peripheral part 4 and the thickness tMin of the thinnest portion is 30% or greater of the thickness tMin of the thinnest portion.

In the first surface electrode 2, for example, the thickness of the center part is 0.10 to 20 µm, the thickness of the thicker region 5 is 0.50 to 40 µm, and the thickness of the thinner region 6 is 0.15 to 30 µm. Further, in a plan view, the areal fraction of the thinner region 6 of the first surface electrode 2 is about 5 to 20% relative to the entirety of the peripheral part 4.

As such, the first surface electrode 2 has the peripheral part 4 which is thicker than the center part, and the peripheral part 4 includes the thicker region 5 which is greater in thickness measured from the face facing the one principal face of the piezoelectric body 1 to the face on the opposite side thereto and the thinner region 6 which is thinner than the thicker region 5. Thus, the first surface electrode 2 can be deformed toward a space formed by the thickness difference between the thicker region 5 and the thinner region 6 and hence, when a pressure acts on the piezoelectric element 10, stress concentration acting from the first surface electrode 2 onto the piezoelectric body 1 is suppressed. This suppresses occurrence of cracks in the interface between the surface electrode and the piezoelectric body 1 so that the piezoelectric element 10 having an improved long term reliability can be obtained. Here, in a case where the piezoelectric element 10 is used as a pressure sensor, a pressure sensor providing a stable output can be obtained.

In FIGS. 1A, 1B, 2A and 2B, description has been given for an example that the peripheral part 4 of the first surface electrode 2 includes the thicker region 5 and the thinner region 6. Instead, the peripheral part 4 of the second surface electrode 3 may include the thicker region 5 and the thinner region 6. Alternatively, the peripheral parts 4 of both the first surface electrode 2 and the second surface electrode 3 may individually include the thicker region 5 and the thinner region 6.

Figure 3A:
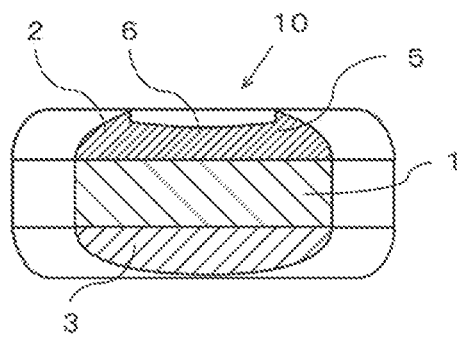
FIGS. 3A to 3C are diagrams showing variations of the cross section taken along the line Z-Z' in FIG. 1B.
Figure 3B:
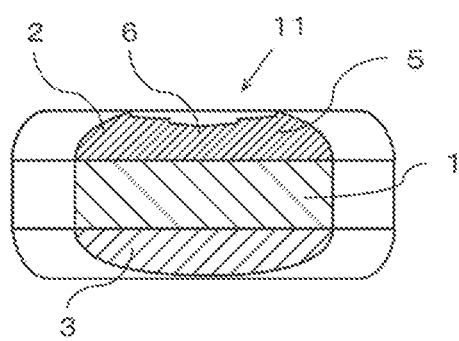
Figure 3C:
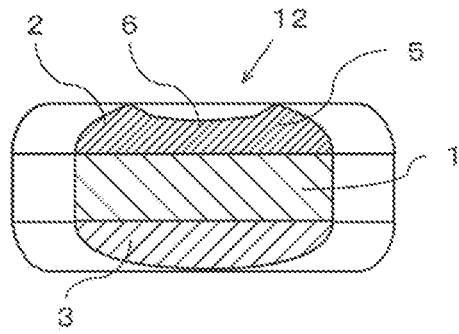
Figure 4:
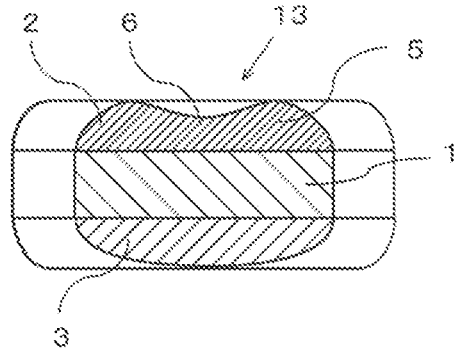
FIG. 4 is a diagram showing another example of the cross section taken along the line Z-Z' in FIG. 1B.

FIGS. 3A to 3C are diagrams showing variations of the cross section taken along the line Z-Z' in FIG. 1B. FIG. 4 is a diagram showing another example of the cross section taken along the line Z-Z' in FIG. 1B.

FIGS. 3A to 3C and 4 show variations of the example in which the thickness varies from the thicker region 5 toward the thinner region 6. The piezoelectric element 10 shown in FIG. 3A is of a form that a level difference is provided between the thicker region 5 and the thinner region 6, wherein the depressed region corresponds to the thinner region 6 and the region in the outside thereof corresponds to the thicker region 5. The piezoelectric element 11 shown in FIG. 3B is of a form that two level differences are provided, wherein the region which is smaller in thickness corresponds to the thinner region 6 and the region in the outside thereof, including the step-shaped portion, corresponds to the thicker region 5. The piezoelectric element 12 shown in FIG. 3C is of a form that an inclined part is provided between the thicker region 5 and the thinner region 6. Then, the region which is smaller in thickness corresponds to the thinner region 6 and the region in the outside thereof, including the inclined part, corresponds to the thicker region 5.

In a case where a level difference is provided between the thicker region 5 and the thinner region 6 as shown in FIGS. 3A and 3B, when a pressure acts on the piezoelectric element 10, the thicker region 5 is deformed so as to spread toward the space formed by the thickness difference between the thicker region 5 and the thinner region 6 so that stress concentration acting from the first surface electrode 2 onto the piezoelectric body 1 is suppressed. This suppresses occurrence of cracks in the interface between the surface electrode and the piezoelectric body 1 so that the piezoelectric element 10 having an improved long term reliability can be obtained.

Further, in a case where an inclined part is provided between the thicker region 5 and the thinner region 6 as shown in FIG. 3C, a level difference is absent between the thicker region 5 and the thinner region 6, and hence the stress is dispersed more uniformly so that stress concentration acting from the first surface electrode 2 onto the piezoelectric body 1 is suppressed further.

Further, the piezoelectric element 13 shown in FIG. 4 is of an example in which the thickness gradually varies from the thicker region 5 toward the thinner region 6 among the examples in which the thickness varies from the thicker region 5 toward the thinner region 6. By virtue of this, when a pressure acts on the piezoelectric element 13, the thicker region 5 is deformed smoothly toward the space formed by the thickness difference between the thicker region 5 and the thinner region 6 so that the stress is dispersed more uniformly between the thicker region 5 and the thinner region 6. In particular, in a case where the piezoelectric element 13 is used as a pressure sensor, the output of the pressure sensor is stabilized.

Figure 5A:
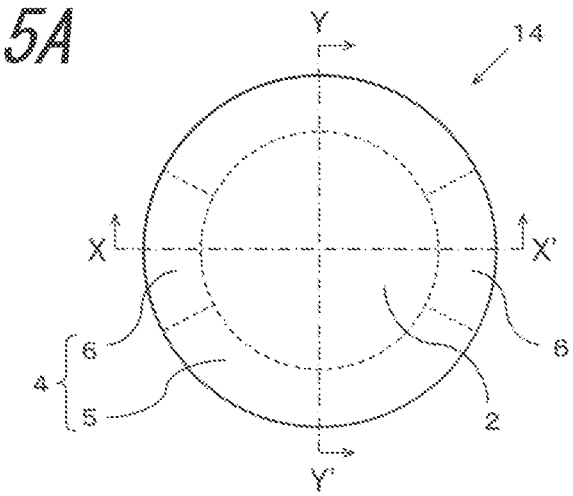
FIG. 5A is a plan view showing another example of the piezoelectric element of the present embodiment.
Figure 5B:
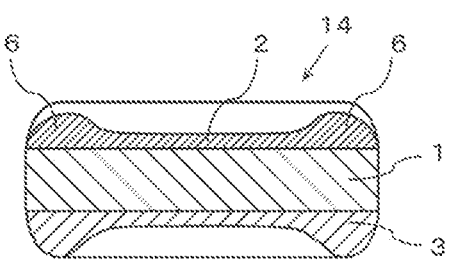
FIG. 5B is a sectional view taken along the line X-X' in FIG. 5A.
Figure 5C:
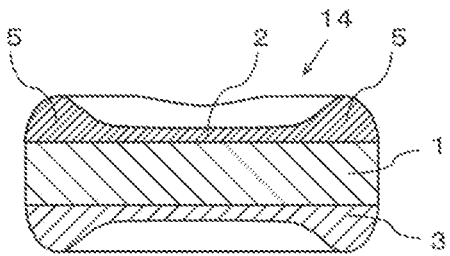
FIG. 5C is a sectional view taken along the line Y-Y' in FIG. 5A.

FIG. 5A is a plan view showing another example of the piezoelectric element 14 of the present embodiment, FIG. 5B is a sectional view taken along the line X-X' in FIG. 5A, and FIG. 5C is a sectional view taken along the line Y-Y' in FIG. 5A.

In the piezoelectric element 14 shown in FIGS. 5A to 5C, the thinner region 6 is provided in two places. This provides an increase of the location toward which the thicker region 5 can be deformed and hence occurrence of cracks can be suppressed further. Here, the thinner region 6 may be provided in more than two places. Further, in a case where the thinner region 6 is provided in a plurality of places, it is preferable that the thinner regions 6 are provided at point-symmetric positions with respect to the centroid of the piezoelectric body 1. By virtue of this, the stress is dispersed uniformly in the peripheral part 4 of the first surface electrode 2 so that stress concentration acting from the first surface electrode 2 onto the piezoelectric body 1 is suppressed and hence occurrence of cracks can be suppressed further.

Figure 6:
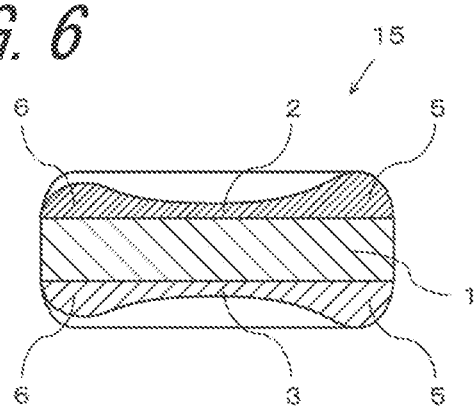
FIG. 6 is a sectional view showing yet another example of the piezoelectric element of the present embodiment, taken along the line X-X'.

FIG. 6 is a sectional view showing yet another example of the piezoelectric element 15 of the present embodiment, taken along the line X-X'. In the piezoelectric element 15 shown in FIG. 6, the peripheral parts 4 of both the first surface electrode 2 and the second surface electrode 3 individually include the thinner region 6. By virtue of this, stress concentration is suppressed in both principal faces of the piezoelectric body 1 composed of the one principal face and the other principal face. Further, as shown in FIG. 6, a configuration may be employed that the thinner regions 6 are provided so as to be opposite to each other with the piezoelectric body 1 in between. By virtue of this, the locations toward which the thicker regions 5 can be deformed when a pressure acts on the piezoelectric element 15 coincide with each other in the first surface electrode 2 and the second surface electrode 3. Thus, a larger deformation is allowed in the thicker regions 5. Accordingly, the piezoelectric element 15 having an improved long term reliability can be obtained.

Next, a method for manufacturing the piezoelectric element 10 of the present embodiment is described below.

First, calcined powder of piezoelectric ceramics and a binder composed of an organic polymer such as an acryl-based polymer or a butyral-based polymer are mixed together to prepare raw material powder. The employed piezoelectric ceramics may be arbitrary one as long as a piezoelectric property is provided. For example, a perovskite type oxide composed of lead zirconate titanate ($PbZrO_3$—$PbTiO_3$) may be employed. Then, the raw material powder is molded by pressing or the like and then de-binder processing is performed at a predetermined temperature. After that, firing is performed at a temperature of 900° C. to 1500° C. Then, grinding processing is performed so as to obtain a predetermined shape by using a surface grinding machine or the like to prepare the piezoelectric body 1.

Then, an electroconductive paste constituting the first surface electrode 2 and the second surface electrode 3 is prepared. Specifically, glass powder together with a binder and a plasticizer is added to silver metal powder and then these materials are mixed together to prepare the electroconductive paste. This electroconductive paste is printed and applied on the above-mentioned piezoelectric body 1 by screen printing in patterns of the first surface electrode 2 and the second surface electrode 3. Further, de-binder processing is performed at a predetermined temperature onto the piezoelectric body 1 on which the electroconductive paste has been printed. After that, firing is performed at a temperature of 600° C. to 900° C.

Here, a method for preparing the thicker region 5 and the thinner region 6 is described below. For example, when the electroconductive paste is printed by screen printing, the printing is performed by using the electroconductive paste having an adjusted viscosity so that a part of the peripheral part 4 can be formed. By utilizing this, printing at the first time is performed so that the thickness of the peripheral part 4 may become equal to that of the thinner region 6, and thereafter printing at the second time is performed on the thicker region 5 alone. Alternatively, printing may be performed so that the thickness of the peripheral part 4 may become equal to that of the thicker region 5, and thereafter a part of the thicker region 5 may be scraped by polishing or otherwise so that the thinner region 6 may be formed. Other employable methods include: a method of controlling the shape and the pressing intensity of the squeegee at the time of screen printing so as to make thicknesses different in the thicker region 5 and the thinner region 6 from each other; and a method of making mesh intervals different in the thicker region 5 and the thinner region 6 from each other. Further, a method of making patterns at the time of printing different in the thicker region 5 and the thinner region 6 from each other. Furthermore, when a thin film method such as vapor deposition is employed in place of screen printing, as an employable method for making thicknesses different in the thicker region 5 and the thinner region 6 from each other there is a method of preparing a plurality of mask patterns and performing film formation plural times.

By virtue of the above-mentioned methods, the piezoelectric element 10 of the present embodiment can be manufactured.

Here, the employed method for manufacturing the piezoelectric element 10 is not limited to those described above and any other manufacturing method may be employed.

Examples

Examples of the invention are described below.

The piezoelectric elements of the invention were fabricated as follows. First, calcined powder of piezoelectric ceramics composed mainly of lead zirconate titanate ($PbZrO_3$—$PbTiO_3$) having an average particle size of 0.8 μm and a binder were mixed together to prepare raw material powder. Then, the raw material powder was molded by pressing and then de-binder processing was performed at 600° C. to 1200° C. After that, firing was performed at 980° C. to 1500° C. After that, polishing was performed by using a polishing machine so that a thickness of 300 to 900 μm is achieved. Then, processing was performed so as to obtain a disk shape of 5.0 mm in diameter to prepare the piezoelectric body.

Next, a binder was added to powder of silver and glass to prepare an electroconductive paste constituting each surface electrode.

Next, the electroconductive paste constituting each surface electrode was printed on the piezoelectric body by screen printing. At that time, the thicker region was formed by printing the electroconductive paste twice. That is, the peripheral part having a thickness equal to that of the thinner region was formed by the first-time printing of the electroconductive paste. Then, the second-time printing was performed only on the portion of the peripheral part corresponding to the thicker region excluding a portion corresponding to the thinner region, so that the thinner region and the thicker region were formed in the peripheral part. Here, the thickness of the thicker region was 0.50 to 40 μm. Further, the thickness of the thinner region was 0.15 to 30 μm, and the thickness of the center part was 0.1 to 20 μm.

Then, the electroconductive paste was baked onto the piezoelectric body at a temperature of 600° C. to 900° C. so that the first surface electrode was formed on the one principal face of the piezoelectric body. As a result, as shown in FIGS. 1A, 1B, 2A and 2B, a piezoelectric element (Sample 1) configured so that the peripheral part of the first surface electrode includes a thicker region which is greater in thickness and a thinner region which is thinner than the thicker region, was manufactured.

Further, as Sample 2, as shown in FIGS. 5A to 5C, a piezoelectric element configured so that two thinner regions were provided on the first surface electrode, was manufactured.

Further, as Sample 3, as shown in FIG. 6, a piezoelectric element configured so that thinner regions were individually provided in the peripheral parts of the first surface electrode and the second surface electrode so as to be opposite to each other with the piezoelectric body positioned in between, was manufactured.

Further, as a comparative example, a piezoelectric element (Sample 4) configured so that the entirety of the peripheral part of the surface electrode was formed as a thicker region and a thinner region was not formed in the peripheral part of the surface electrode, was also manufactured.

These piezoelectric elements (Samples 1 to 4) were individually put into metal holders and then a pressure of 1000 N was applied by using a load test measurement machine, and respective pressure sensor outputs were measured. All piezoelectric elements of Samples 1 to 4 obtained individually an output of approximately 300 μC.

Further, as a durability test, this evaluation was repeated $1.0 \times 10^9$ times with vibration of 200 Hz.

According to a result of SEM (Scanning Electron Microscope) analysis performed on each piezoelectric element, in the piezoelectric elements of Samples 1, 2, and 3 which were the examples of the invention, cracks did not occur in the interface between the surface electrode and the piezoelectric body. Further, when the output signal of each sample was evaluated, a value thereof was equivalent to a value prior to the test, and hence degradation was not observed.

In contrast, in the piezoelectric element of Sample 4 which was the comparative example, cracks occurred in the interface between the surface electrode and the piezoelectric body. Further, when the output signal of Sample 4 was evaluated, an output value thereof was lower than a value prior to the test, and hence degradation was observed.

In conclusion, the piezoelectric elements of the examples have an excellent long term reliability in comparison with the piezoelectric element of the comparative example.

REFERENCE SIGNS LIST

1: Piezoelectric body
2: First surface electrode
3: Second surface electrode
4: Peripheral part
5: Thicker region
6: Thinner region
10, 11, 12, 13, 14, 15: Piezoelectric element

The invention claimed is:

1. A piezoelectric element, comprising:
a plate-shaped piezoelectric body having one principal face and the other principal face which are opposite to each other; and
a first surface electrode mounted on the one principal face and a second surface electrode mounted on the other principal face,
at least one of the first surface electrode and the second surface electrode, including a center part and a peripheral part which is greater in thickness than the center part, the peripheral part extending along an outer periphery of the piezoelectric body having a thicker region and a thinner region which is thinner than the thicker region, in a direction along the outer periphery of the piezoelectric body.

2. The piezoelectric element according to claim 1, wherein a thickness of the peripheral part gradually varies as going from the thicker region toward the thinner region.

3. The piezoelectric element according to claim 1, wherein the thinner region includes a plurality of thinner regions.

4. The piezoelectric element according to claim 1, wherein peripheral parts of both the first surface electrode and the second surface electrode have the thinner regions, respectively.

5. The piezoelectric element according to claim 4, wherein the thinner regions are provided opposite to each other with the piezoelectric body positioned in between.

6. The piezoelectric element according to claim 1, wherein the piezoelectric body is made of ceramics having a piezoelectric property.

* * * * *